US012620934B2

(12) United States Patent
Lee et al.

(10) Patent No.: US 12,620,934 B2
(45) Date of Patent: May 5, 2026

(54) ENVELOPE-DETECTOR-LESS FORWARD DATA RECEIVING DEVICE

(71) Applicant: Korea University Research and Business Foundation, Seoul (KR)

(72) Inventors: Hyung-Min Lee, Seoul (KR); Hyun-Su Lee, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 19/079,164

(22) Filed: Mar. 13, 2025

(65) Prior Publication Data

US 2025/0330123 A1     Oct. 23, 2025

(30) Foreign Application Priority Data

Apr. 18, 2024     (KR) ........................ 10-2024-0052317

(51) Int. Cl.
*H03C 1/36*           (2006.01)
(52) U.S. Cl.
CPC ..................................... *H03C 1/36* (2013.01)
(58) Field of Classification Search
CPC ......... H03C 1/36; H04L 27/06; H04L 7/0008; H04L 7/0079; H04L 25/4902; H02M 1/007; H02M 7/21; H03K 3/037; H03K 5/135; H02J 50/10
See application file for complete search history.

(56) References Cited

U.S. PATENT DOCUMENTS 11,533,053 B2     12/2022  Delshadpour et al.
2021/0385114 A1*  12/2021  Mehas ..................... H02J 50/12

FOREIGN PATENT DOCUMENTS

KR     10-2014-0039507 A     4/2014
KR     10-2015-0028133 A     3/2015
KR     10-2015-0103954 A     9/2015
KR     10-2018-0010057 A     1/2018
KR          10-2206796 B1     1/2021

* cited by examiner

*Primary Examiner* — Jeffrey M Shin
(74) *Attorney, Agent, or Firm* — BROADVIEW IP LAW, PC

(57)           ABSTRACT

An embodiment includes a forward data receiving device that demodulates and receives an Amplitude Shift Keying (ASK) modulation signal, and includes: an input module configured to receive the ASK modulation signal as an input; a resonance regulating rectifier module configured to regulate and rectify an input voltage of the ASK modulation signal on the basis of Pulse Width Modulation (PWM) according to a preset target voltage, and apply a regulated voltage through an output transistor; and a demodulation module configured to demodulate the ASK modulation signal according to a trend in a change of the input voltage compared to the regulated voltage, wherein the resonance regulating rectifier module includes a comparison unit configured to generate a gate signal for controlling on/off of the output transistor, and generate a sample signal for demodulating the ASK modulation signal.

8 Claims, 13 Drawing Sheets

FIG. 2

ENVELOPE-DETECTOR-LESS FORWARD DATA RECEIVING DEVICE

CROSS REFERENCE TO RELATED APPLICATIONS

This application claims priority to Korean Patent Application No. 10-2024-0052317, filed on Apr. 18, 2024, in the Korean Intellectual Property Office, which is incorporated by reference herein in its entirety.

FIELD OF THE INVENTION

The present invention relates to a forward data receiving device that does not require an envelope detector, which is implemented using only digital circuits to reduce power consumption.

BACKGROUND OF THE RELATED ART

Techniques of supplying power through Wireless Power Transfer (WPT), which supplies power wirelessly instead of supplying power through wires in electronic devices, are emerging. Such a wireless power transfer system may transmit and receive power through change in the magnetic field of coils at both ends of transmitting and receiving sides.

The receiving side is mostly in a single-stage structure configured of an AC-DC rectifier and a DC-DC converter. The AC-DC rectifier converts AC voltage into DC voltage, and at this point, the DC voltage is not set to a target voltage value, but varies according to the distance between the coils and the angle and the load (RL) of the coils through feedback.

Therefore, the DC-DC converter is essential at the rear end, and may convert unstable DC voltage into stable DC voltage through feedback. In addition, this stable DC voltage may be regulated according to the goal of a consumer and designer, and almost does not change according to the distance between the coils and the angle and the load of the coils.

FIG. 1 is a view showing a conventional resonance regulating rectifier, and FIG. 2 is a view for explaining conventional voltage width modulation (hereinafter, referred to as PWM) technology.

As shown in FIG. 1, recently, resonance regulating rectifiers that reduce a two-stage structure to a single-stage structure are used widely. Such one-stage resonance regulating rectifiers have advantages of high power conversion efficiency, a high voltage conversion rate, and a small chip area.

In addition, in order to convert AC voltage into a stable target DC voltage using a single-stage structure, PWM technology is used as shown in FIG. 2. The PWM technology reduces the width of gate voltage when the target voltage is low, and increases the width of gate voltage when the target voltage is high.

In addition, such a resonance regulating rectifier may transmit wireless power from a transmitter TX to a receiver RX via a pair of coils L1 and L2 as shown in FIG. 1, and may also transmit data from a transmitter TX to a receiver RX or from a receiver RX to a transmitter TX.

At this point, it is general that sending data from a transmitter TX to a receiver RX is referred to as forward telemetry (FT or downlink), and sending data from a receiver RX to a transmitter TX is referred to as backward telemetry (BT or uplink).

Meanwhile, FIG. 3 is a view showing an FT Amplitude Shift Keying (ASK), which is a method of a conventional amplitude phase modulator. Specifically, FIG. 3a is a view showing a circuit diagram of conventional ASK FT, and FIG. 3b is a view showing a waveform of ASK FT.

The conventional ASK FT method is configured of an FT demodulator including an envelope detector and an analog comparator as shown in FIG. 3.

In addition, the cross-coupled NMOS pair N1 and N2 converts a full-wave voltage to half-wave voltages VIN1 and VIN2. In addition, half of the current in the power path flows from VIN1 to VREG through a first power pass PMOS transistor P1 controlled by a first gate control voltage VG1. In the same manner, the other half of the current in the power path is directed from VIN2 to VREG through a second PMOS transistor P2 by controlling a second gate control voltage VG2.

At this point, the envelope detector is configured of PMOS transistors P3 and P4 connected through a diode, a storage capacitor CENV, and a current path resistor RENV. This envelope detector looks like another type of rectifier, and requires another current for the FT path, as well as the WPT.

The auxiliary current of the FT path is formed from VINN and VINP to GND through the PMOS transistors P3 and P4 and the current path resistance RENV, and this generates output voltage VENV of the envelope detector. The output voltage VENV decreases as VTX decreases, and the analog comparator detects the decrease and compares it with a reference voltage VREF to generate the digital output VFT of the demodulator. Since the output voltage VENV is generated by an RC-based envelope detector, decrease of the output voltage VENV varies according to the input data value and the data rate.

In addition, since the magnitude of the capacitance CENV is usually 100 pF or more, and the capacitor occupies a significant part of the chip area, existing FT demodulators have a problem of consuming considerable power due to the envelope detector including the auxiliary power path and the analog comparator.

Therefore, a method that can reduce the power consumption according to the envelope detector and the chip size due to the passive components is needed on the receiving side that receives wireless power.

(Patent Document 1) Korean Patent Publication No. 10-2013-0132624

SUMMARY OF THE INVENTION

The present invention is conceived to solve the problems, and an object of the present invention is provided a forward data receiving device that does not require an envelope detector, which can reduce the size of a chip, as well as power consumption, by omitting the envelope detector, which is an analog circuit block that consumes a large amount of power, by using only digital circuits.

Therefore, the present invention has been made to achieve to the object, and there is provided a forward data receiving device that demodulates and receives an Amplitude Shift Keying (ASK) modulation signal, the device comprising: an input module configured to receive the ASK modulation signal as an input; a resonance regulating rectifier module configured to regulate and rectify an input voltage of the ASK modulation signal on the basis of Pulse Width Modulation (PWM) according to a preset target voltage, and apply a regulated voltage through an output transistor; and a demodulation module based on a digital logic circuit, configured to demodulate the ASK modulation signal according to a trend in a change of the input voltage compared to the regulated voltage, wherein the resonance regulating rectifier module includes a comparison unit configured to generate a gate signal for controlling on/off of the output transistor, and generate a sample signal for demodulating the ASK modulation signal according to the trend in the change of the input voltage compared to the regulated voltage.

In addition, the demodulation module may include: a digital cleaner unit configured to generate a clean signal by removing a resonant frequency noise of the ASK modulation signal from the sample signal; and a synchronization unit configured to synchronize the clean signal according to the resonant frequency and a data rate of the ASK modulation signal.

In addition, the resonance regulating rectifier module may further include a conversion unit configured to convert the input voltage into a half-wave voltage, and branching the input voltage into a path of a first input voltage and a path of a second input voltage, wherein the comparison unit may include: a first comparison unit configured to generate a first gate signal and a first sample signal for controlling on/off of a first output transistor corresponding to the path of the first input voltage; and a second comparison unit configured to generate a second gate signal and a second sample signal for controlling on/off of a second output transistor corresponding to the path of the second input voltage.

In addition, the digital cleaner unit may include: a first frequency divider configured to output a first frequency division signal as the first sample signal is applied; a second frequency divider configured to output a second frequency division signal as the second sample signal is applied; a first adder configured to output a first sum signal by adding the first frequency division signal and the second frequency division signal; a delay cell configured to output a delay signal as the first sum signal is input; a second adder configured to output a second sum signal by adding the first sum signal and the delay signal; a third adder configured to output a third sum signal by adding the first sample signal and the second sample signal; and a fourth adder configured to output the clean signal by adding the third sum signal and the second sum signal.

In addition, the synchronization unit may include: a first clock generator configured to generate a first clock signal having the resonant frequency from the first input voltage and the second input voltage; a starter configured to generate a start signal when the clean signal becomes '1'; a second clock generator configured to generate, when the start signal is generated, a second clock signal that becomes a rising edge and has the resonant frequency when the clean signal becomes '1'; a first synchronizer configured to generate a first synchronization signal, which is a clean signal synchronized with the second clock signal, using the second clock signal and the clean signal as inputs; a frequency divider configured to divide the second clock signal by frequency; a delayer configured to generate a signal having a pulse width of the resonant frequency by delaying the frequency-divided second clock signal for a preset cycle; and a second synchronizer configured to finally output a second synchronization signal synchronized with the resonant frequency and the data rate using an output signal of the delayer and the first synchronization signal as inputs as a demodulation signal that demodulates the ASK modulation signal.

In addition, each of the first comparison unit and the second comparison unit may include: a common gate comparator configured to compare the first input voltage or the second input voltage with the regulated voltage, and output a comparison voltage signal, which is a section in which the first input voltage or the second input voltage is higher than the regulated voltage; and a sample signal generator configured to generate a sample signal, which is a signal that includes information on a starting point and an ending point of the comparison voltage signal such that a pulse signal having a rising edge at the starting point and a falling edge at the ending point of the comparison voltage signal.

In addition, each of the first comparison unit and the second comparison unit may further include: a PWM controller configured to generate a PWM control signal by comparing the regulated voltage and the target voltage so that the regulated voltage follows the target voltage; and a gate signal driver configured to generate a gate signal for controlling on/off of the output transistor according to the comparison voltage signal and the PWM control signal.

In addition, the gate signal driver may include: an OR gate configured to generate a protection voltage signal by applying an OR logic operation to a signal applying a rising edge trigger to the PWM control signal and a signal applying a rising edge trigger to the ending point of the comparison voltage signal; and an SR latch configured to receive a signal applying a falling edge trigger at the starting point of the comparison voltage signal and the protection voltage signal, and generate the gate signal having a falling edge at the starting point of the comparison voltage signal and a rising edge at a timing of controlling the regulated voltage.

BRIEF DESCRIPTION OF THE DRAWINGS

Figure 2:
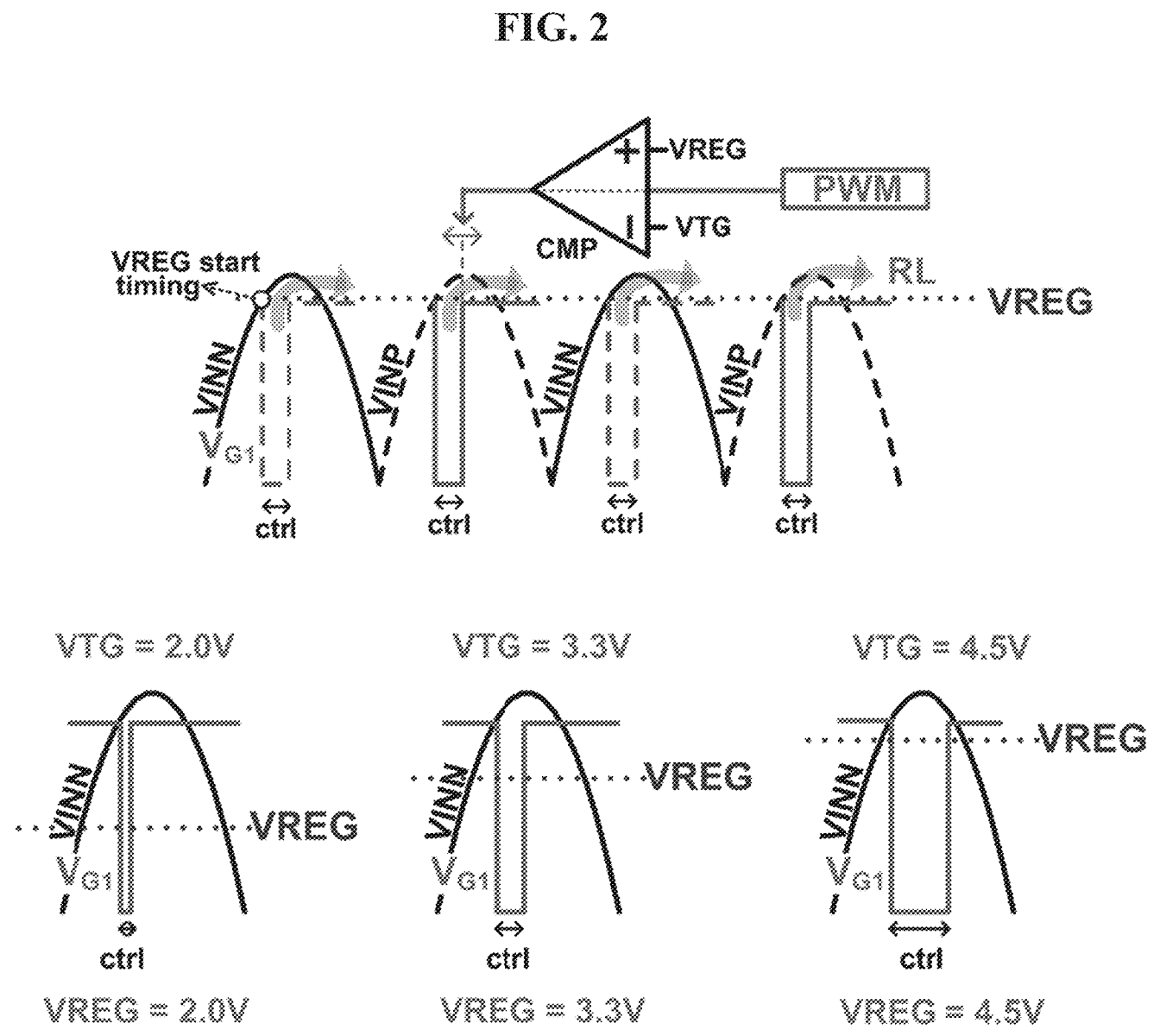

FIG. 2 is a view for explaining conventional PWM technology.

DETAILED DESCRIPTION OF THE PREFERRED EMBODIMENT

Figure 1:
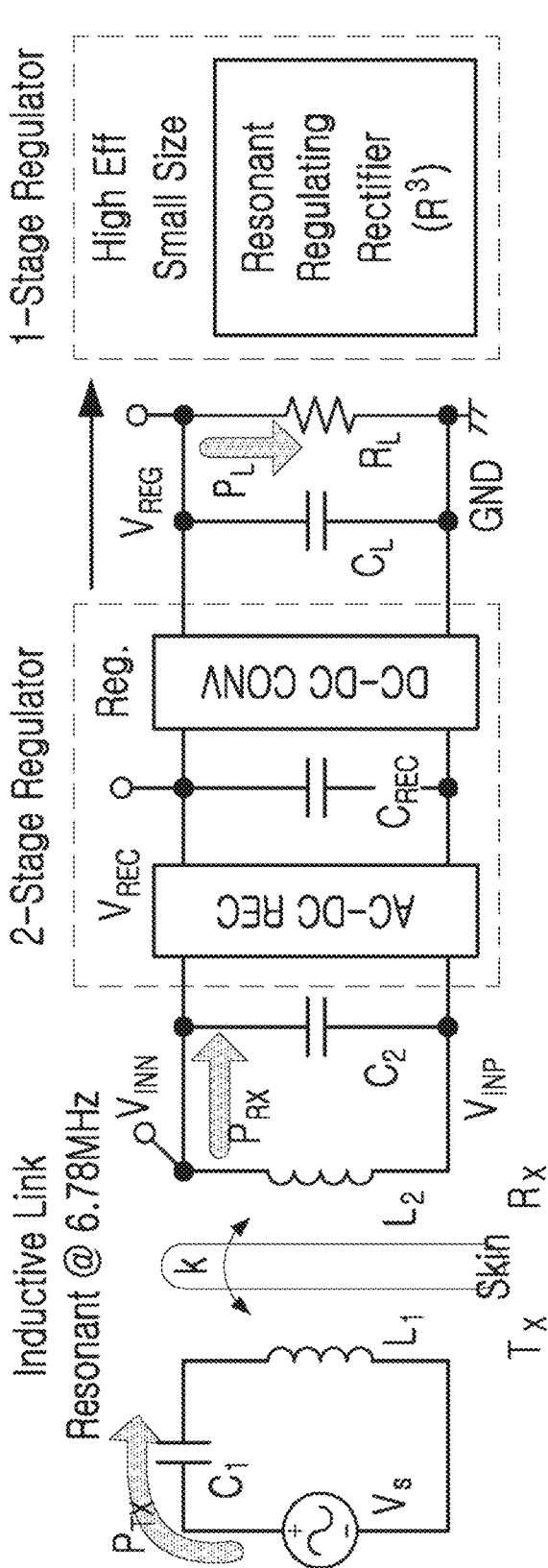
FIG. 1 is a view for explaining a conventional resonance regulating rectifier.

The detailed description of the present invention described below refers to the accompanying drawings which show specific embodiments, in which the present invention may be embodied, as an example. These embodiments are described in sufficient detail so that those skilled in the art may embody the present invention. It should be understood that various embodiments of the present invention do not necessarily need to be mutually exclusive although they are different from one another. For example, specific shapes, structures, and characteristics described herein may be implemented in other embodiments without departing from the spirit and scope of the present invention. It should also be understood that the positions or arrangements of individual components within each disclosed embodiment may be changed without departing from the spirit and scope of the present invention. Accordingly, the detailed description described below is not to be taken in a limiting sense, and when properly described, the scope of the present invention is defined only by the appended claims, together with all the scope equivalent to those asserted by the claims. Like reference numerals in the drawings designate the same or similar functions throughout the several aspects.

The components according to the present invention are defined by functional distinction rather than physical distinction, and may be defined by the functions performed by each of the components. Each component may be implemented as hardware or a program code and a processing unit that performs each function, and functions of two or more components may be implemented to be included in one component. Therefore, the names given to the components in the following embodiments are not to physically distinguish each component, but to imply a representative function performed by each component, and it should be noted that the technical spirit of the present invention is not limited by the names of the components.

Hereinafter, preferred embodiments of the present invention will be described in more detail with reference to the drawings.

Figure 4A:
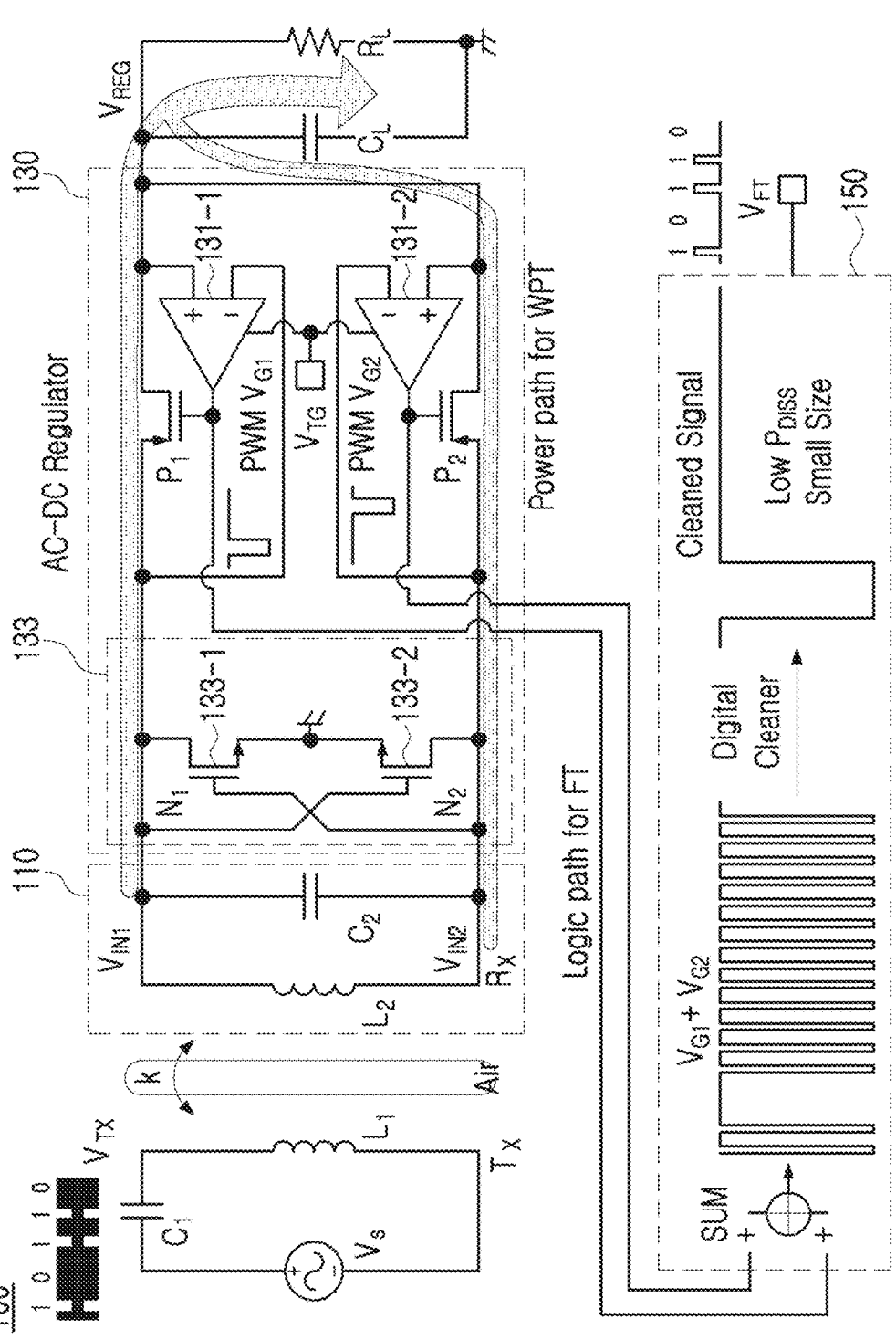
FIG. 4A is a circuit diagram of a forward data receiving device in accordance with an embodiment.
Figure 4B:
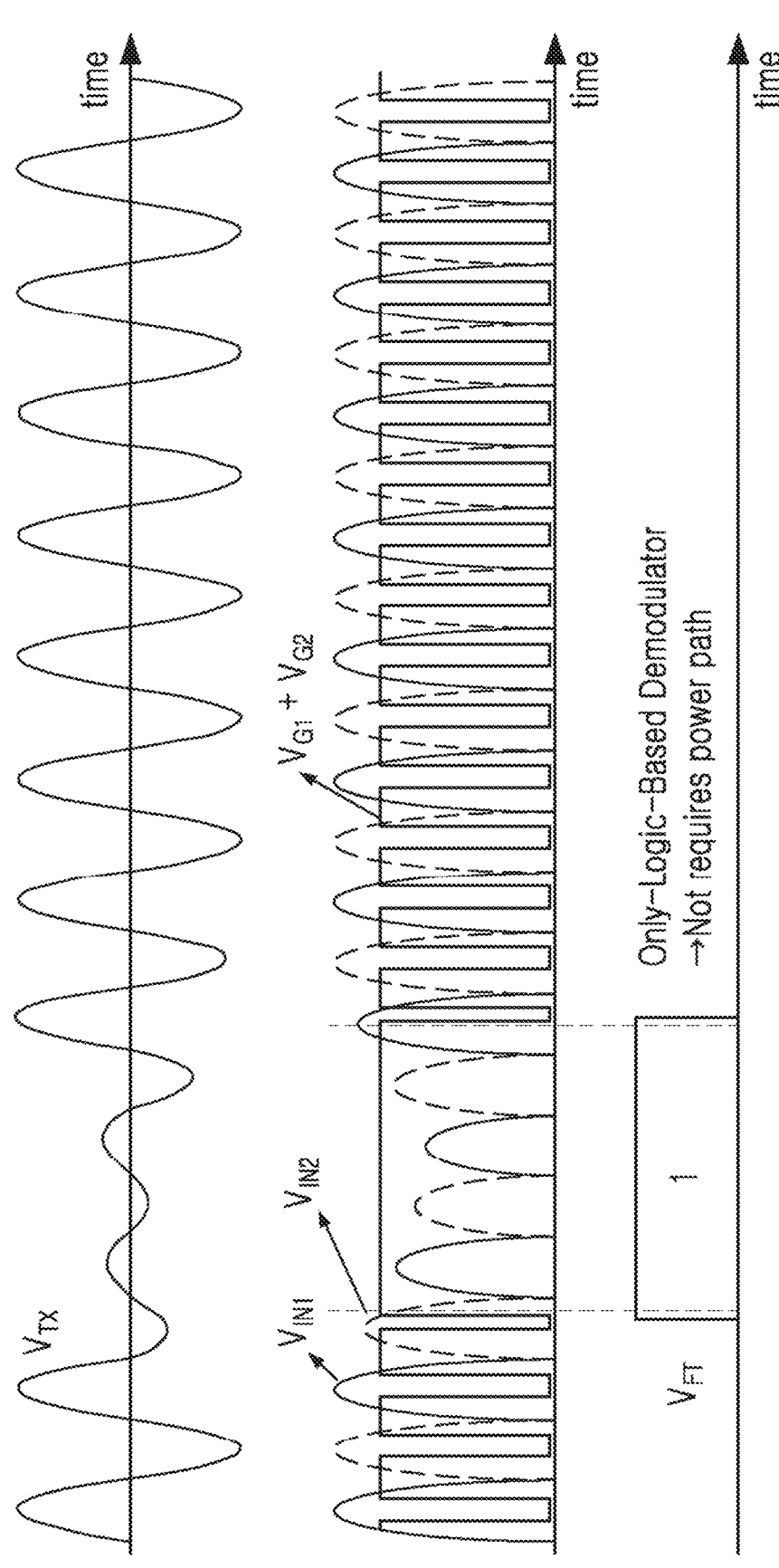
FIG. 4B is a waveform diagram for explaining the forward data receiving device in accordance with an embodiment.

FIG. 4a is a circuit diagram for schematically explaining a forward data receiving device (hereinafter, referred to as a device) 100 according to the present invention, and FIG. 4b is a waveform diagram for explaining the device 100 according to the present invention. In addition, FIG. 5 is an overall circuit diagram for explaining the device 100 according to the present invention.

Figure 3A:
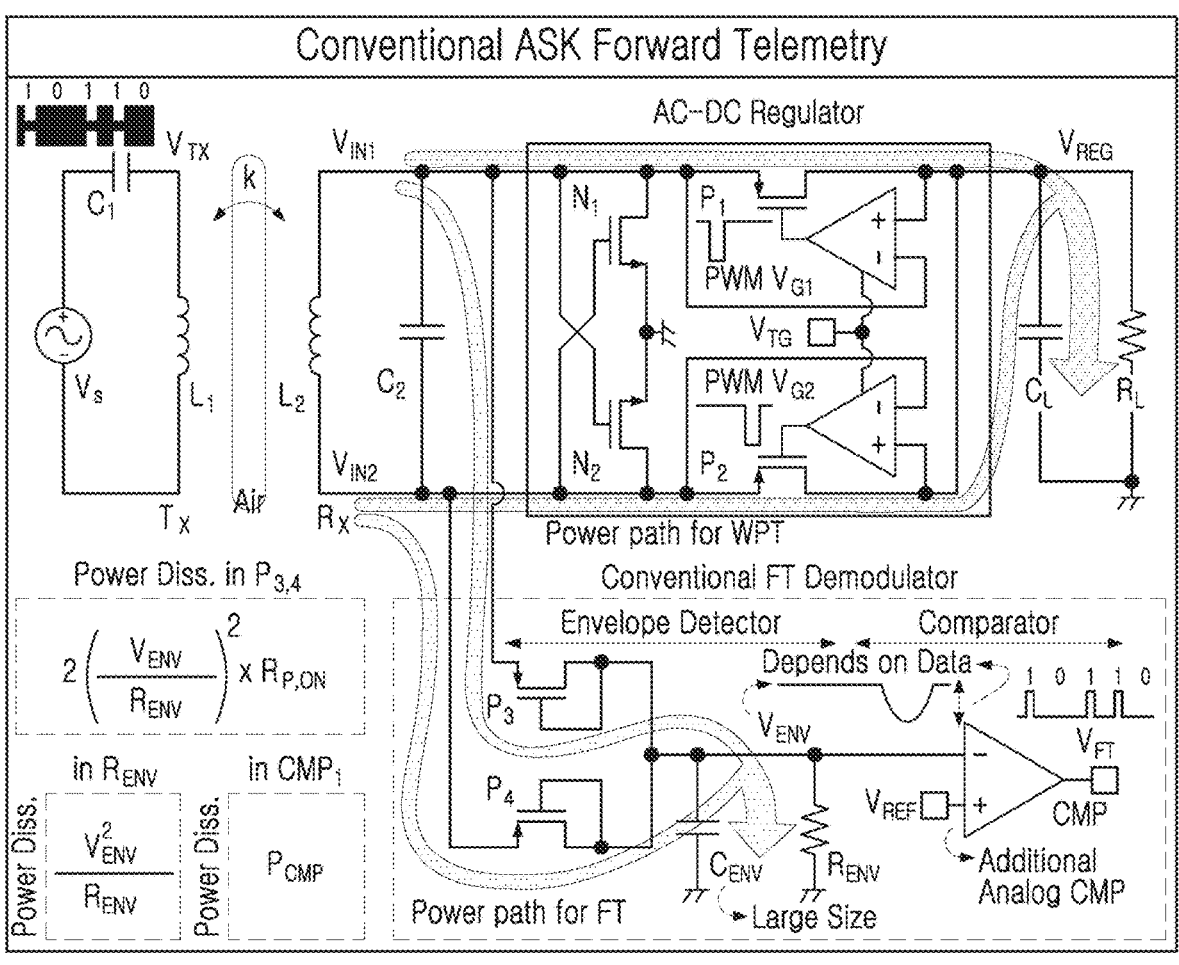
FIG. 3A is a view showing a circuit diagram of conventional ASK FT in accordance with an embodiment.
Figure 3B:
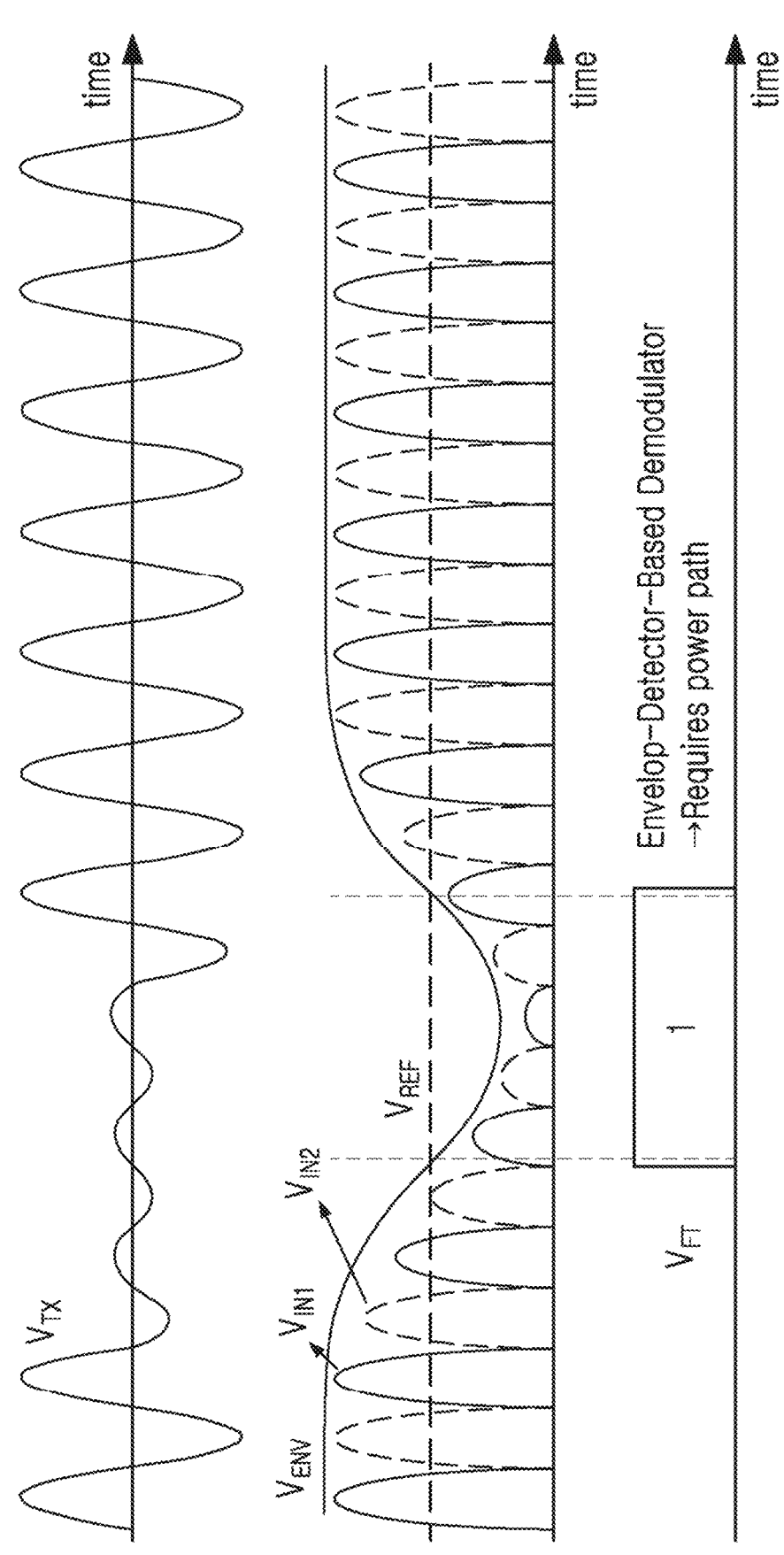
FIG. 3B is a view showing a waveform of ASK FT in accordance with an embodiment.

The device 100 according to the present embodiment is a receiving device that demodulates and receives an Amplitude Shift Keying (ASK) modulation signal, and is provided to reduce power consumption by removing an analog detector that consumes a large amount of power, such as the circuit of conventional ASK FT as shown in FIGS. 3a and 3b, and implementing the device 100 using only digital circuits.

The device 100 according to the present embodiment is briefly described in FIG. 4, and the device 100 of the present invention will be described in more detail in FIGS. 5 to 8.

Figure 5:
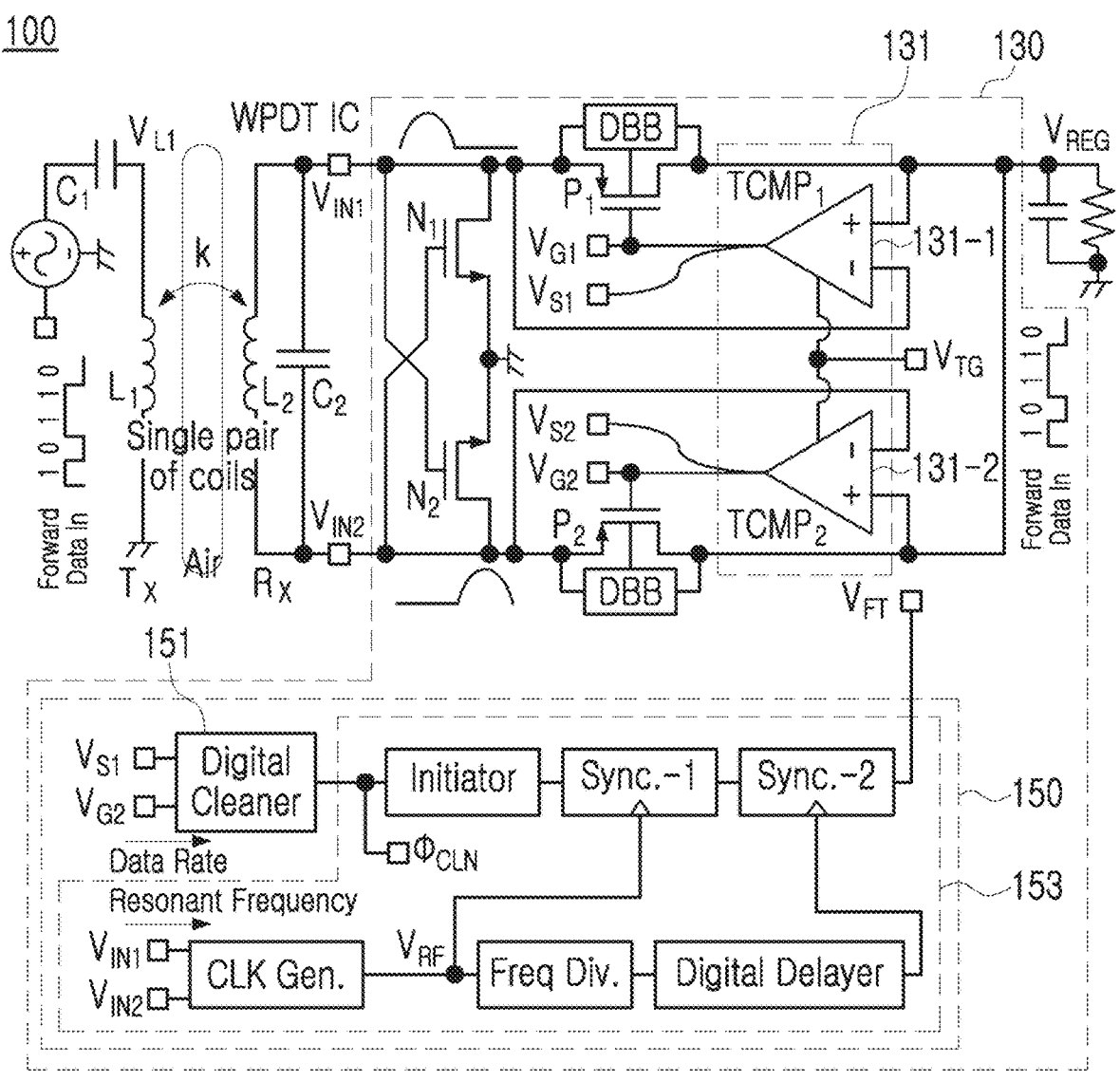
FIG. 5 is an overall circuit diagram for explaining a device according to the present invention.

The device 100 according to the present embodiment may follow a method of removing both an envelope detector and an analog comparator as shown in FIG. 4a and FIG. 5.

To this end, the device 100 according to the present embodiment includes an input module 110, a resonance regulating rectifier module 130, and a demodulation module 150.

The input module 110 may receive an ASK modulation signal as an input. Then, the input module 110 may transfer the received ASK modulation signal to the resonance regulating rectifier module 130.

Meanwhile, the resonance regulating rectifier module 130 according to the present embodiment may be provided to control and rectify the input voltage VIN of the ASK modulation signal on the basis of Pulse Width Modulation (PWM) according to a preset target voltage VTG, and apply a regulated voltage VREG through the output transistors P1 and P2 as shown in FIG. 4a and FIG. 5.

In addition, the resonance regulating rectifier module 130 according to the present embodiment may include a comparison unit 131 and a conversion unit 133.

First, the conversion unit 133 is provided to branch the input voltage VIN and may include a first conversion unit 133-1 and a second conversion unit 133-2.

Specifically, the conversion unit 133 according to the present embodiment may convert the input voltage VIN into a half-wave voltage, and branch it into a path of a first input voltage VIN1 and a path of a second input voltage VIN2.

Meanwhile, the comparison unit 131 according to the present embodiment is provided to generate a gate signal for controlling on/off of the output transistors P1 and P2.

In addition, the comparison unit 131 may generate a sample signal VS for demodulating the ASK modulation signal according to the trend in the change of the input voltage VIN compared to the regulated voltage VREG.

Figure 6A:
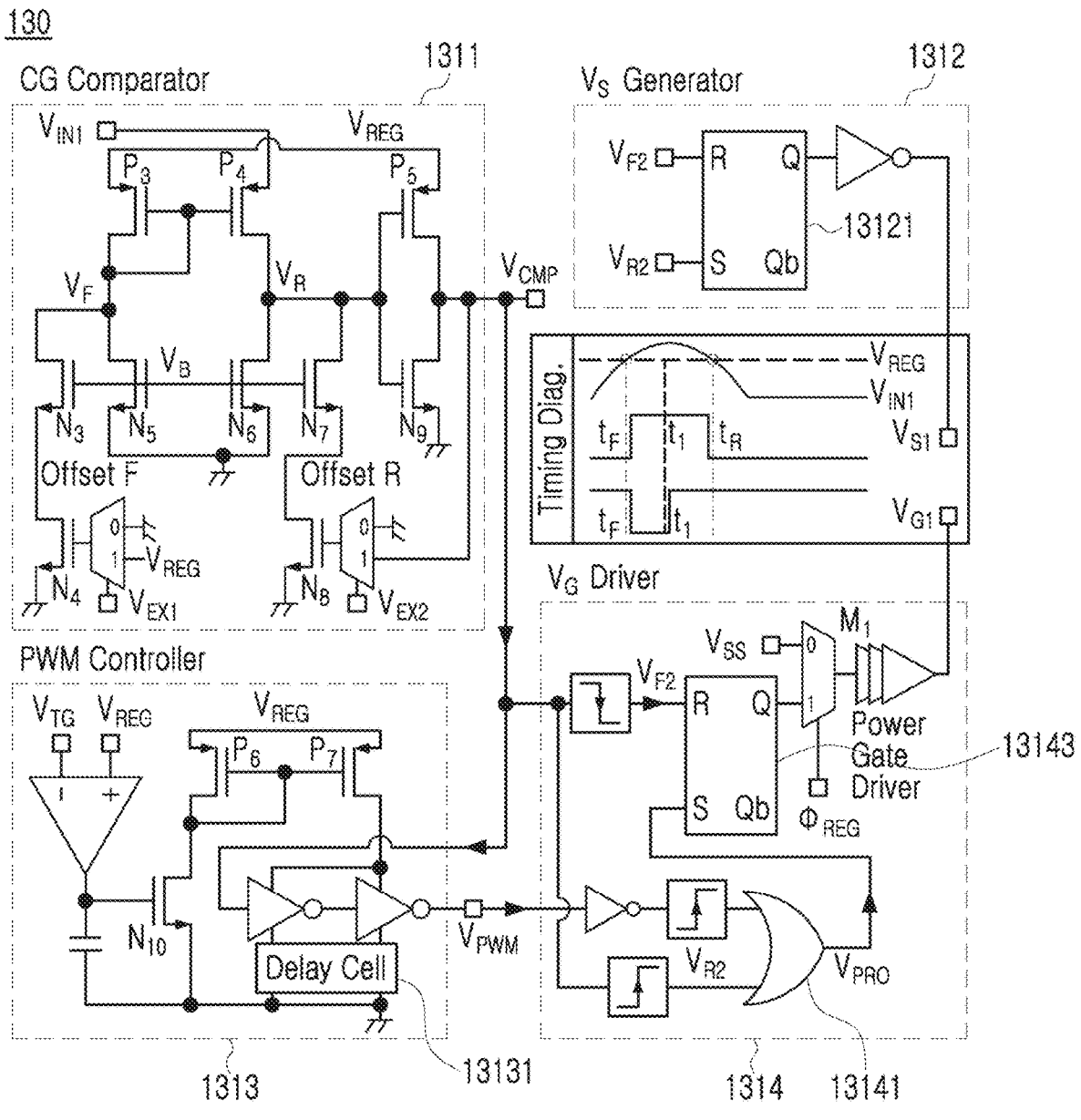
FIG. 6A is a circuit diagram of a comparator in accordance with an embodiment.
Figure 6B:
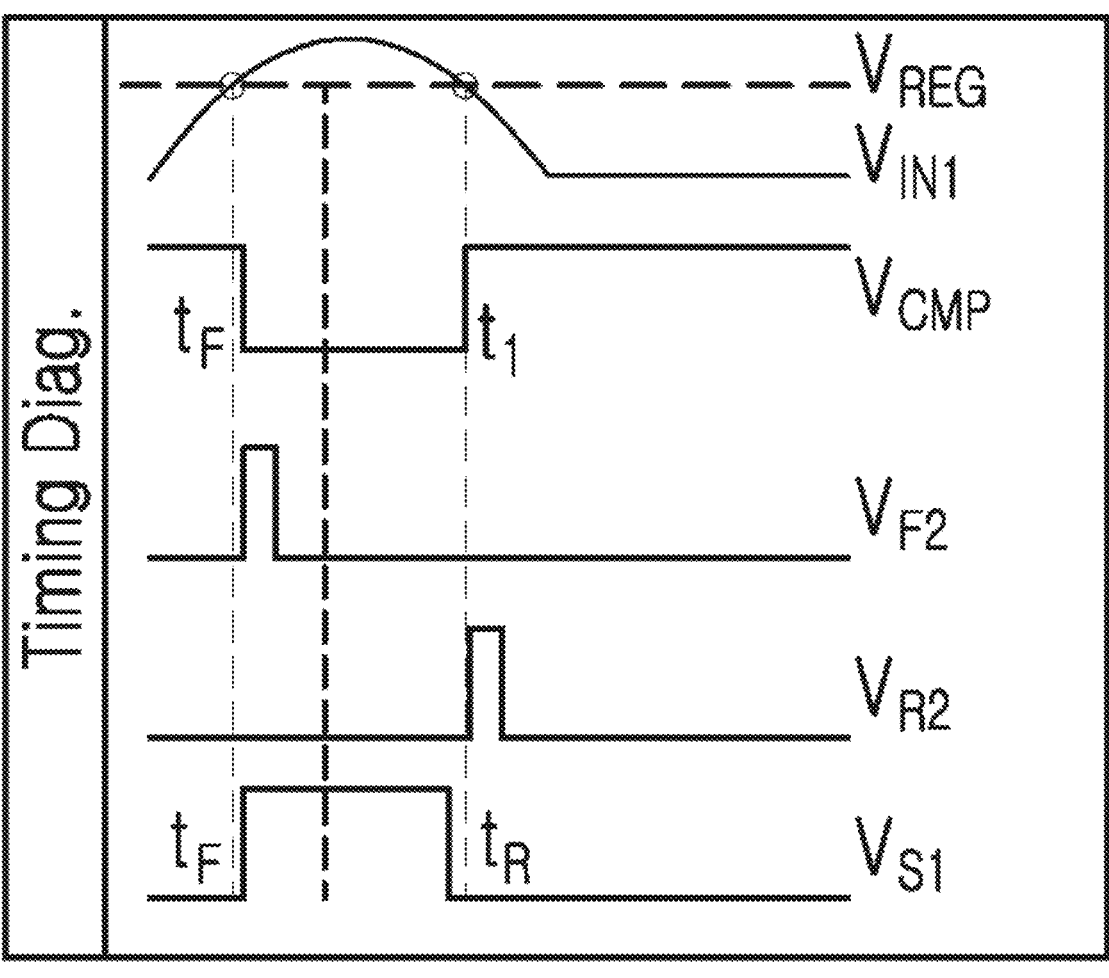
FIG. 6B is a timing diagram showing a waveform of a signal generated by a comparison unit in accordance with an embodiment.

FIG. 6 is a circuit diagram for explaining the comparison unit 131 according to the present embodiment shown in FIG. 5. Specifically, FIG. 6a is a circuit diagram including specific components of the comparison unit 131, and FIG. 6b is a timing diagram showing the waveform of a signal generated by the comparison unit 131.

The comparison unit 131 according to the present embodiment may include a first comparison unit 131-1 and a second comparison unit 131-2.

The first comparison unit 131-1 is provided to generate a first gate signal VG1 and a first sample signal VS1 for controlling on/off of a first output transistor P1 corresponding to the path of the first input voltage VIN1.

On the other, the second comparison unit 131-2 is provided to generate a second gate signal VG2 and a second sample signal VS2 for controlling on/off of a second output transistor P2 corresponding to the path of the second input voltage VIN2.

In addition, each of the first comparison unit 131-1 and the second comparison unit 131-2 according to the present embodiment may include a common gate comparator (CG comparator) 1311, a sample signal generator (VS generator) 1312, a PWM controller 1313, and a gate signal driver (VG driver) 1314.

The common gate comparator 1311 may compare the first input voltage VIN1 or the second input voltage VIN2 with the regulated voltage VREG.

In addition, the common gate comparator 1311 may output a comparison voltage signal VCMP, which is a section in which the first input voltage VIN1 or the second input voltage VIN2 is higher than the regulated voltage VREG.

The comparison voltage signal VCMP output through the common gate comparator 1311 may be transferred to the PWM controller 1313 and the gate signal driver 1314.

Meanwhile, the sample signal generator 1312 is provided to generate a sample signal VS.

The sample signal VS generated by the sample signal generator 1312 is a signal that includes information on the starting point tF and the ending point tR of the comparison voltage signal VCMP.

In addition, the sample signal VS according to the present embodiment is a pulse signal having a rising edge at the starting point tF of the comparison voltage signal VCMP and a falling edge at the ending point tR as shown in the timing diagram (Timing Diag.) shown in FIG. 6a.

The sample signal generator 1312 according to the embodiment may include an SR latch 13121 for generating the sample signal VS.

The SR latch 13121 provided in the sample signal generator 1312 may receive a signal VR2 that applies a rising edge trigger to the ending point of the comparison voltage signal VCMP from the gate signal driver VG1 or VG2 and a signal VF2 that applies a falling edge trigger to the starting point of the comparison voltage signal VCMP as inputs as shown in FIG. 6b, and generate a sample signal VS1 or VS2.

In addition, the sample signal generator 1312 may further include an inverter that inverts the waveform of the comparison voltage signal VCMP.

Meanwhile, the PWM controller 1313 may generate a PWM control signal VPWM by comparing the regulated voltage VREG and the target voltage VTG so that the regulated voltage VREG may follow the target voltage VTG.

In addition, the PWM control signal VPWM generated by the PWM controller 1313 may be transferred to the gate signal driver 1314.

To this end, the PWM controller 1313 may include one or more delay cells 13131 as shown in FIG. 6a.

The delay cell 13131 according to the present embodiment may generate the PWM control signal VPWM by delaying the comparison voltage signal VCMP output from the common gate comparator 1311.

The PWM control signal VPWM generated by the PWM controller 1313 including the delay cell 13131 according to the present embodiment may be a signal having a rising edge at the timing of controlling the regulated voltage VREG by determining the amount of current flowing into the delay cell 13131 according to the difference between the regulated voltage VREG and the target voltage VTG.

Meanwhile, the gate signal driver 1314 is provided to generate gate signals VG1 and VG2 for controlling on/off of the output transistors P1 and P2 according to the comparison voltage signal VCMP and the PWM control signal VPWM.

The gate signal driver 1314 may include an OR gate 13141 and an SR latch 13143.

As shown in FIG. 6b, the OR gate 13141 may generate a protection voltage signal VPRO by applying an OR logic operation to a signal applying a rising edge trigger to the PWM control signal VPWM and a signal VR2 applying a rising edge trigger to the ending point of the comparison voltage signal VCMP.

The protection voltage signal VPRO generated by the OR gate 13141 according to the present embodiment may allow the timing of the rising edge of the gate signal to precede the timing of controlling the regulated voltage VREG.

Meanwhile, the SR latch 13143 provided in the gate signal driver 1314 may receive the signal VF2 that applies a falling edge trigger at the starting point of the comparison voltage signal VCMP, and the protection voltage signal VPRO.

In addition, the SR latch 13143 may generate a gate signal VG1 or VG2 having a falling edge at the starting point of the comparison voltage signal VCMP and a rising edge at the timing of controlling the regulated voltage VREG.

To this end, the gate signal driver 1314 may further include a MUX M1 and a power gate driver as shown in FIG. 6a.

The gate signal VG1 or VG2, which falls at the starting point of the comparison voltage signal VCMP and rises at the timing t1 of controlling the regulated voltage VREG, may be generated through the MUX M1 and the power gate driver.

Meanwhile, the demodulation module 150 according to the present embodiment is provided to demodulate the ASK modulation signal according to the trend in the change of the input voltage VIN compared to the regulated voltage VREG.

In particular, the demodulation module 150 according to the present embodiment may be provided on the basis of a digital logic circuit to demodulate the ASK modulation signal.

Figure 7A:
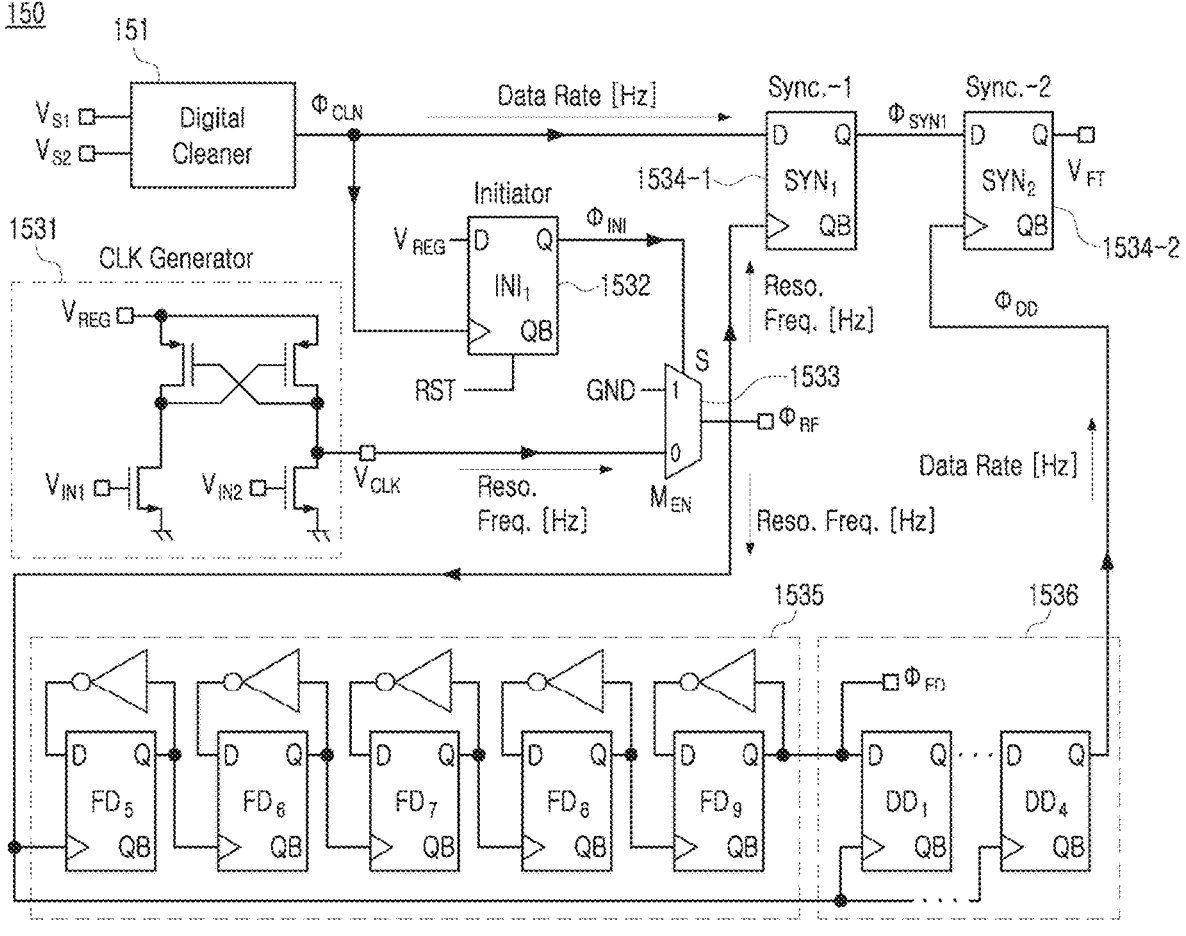
FIG. 7A is a circuit diagram of a demodulation module in accordance with an embodiment.
Figure 7B:
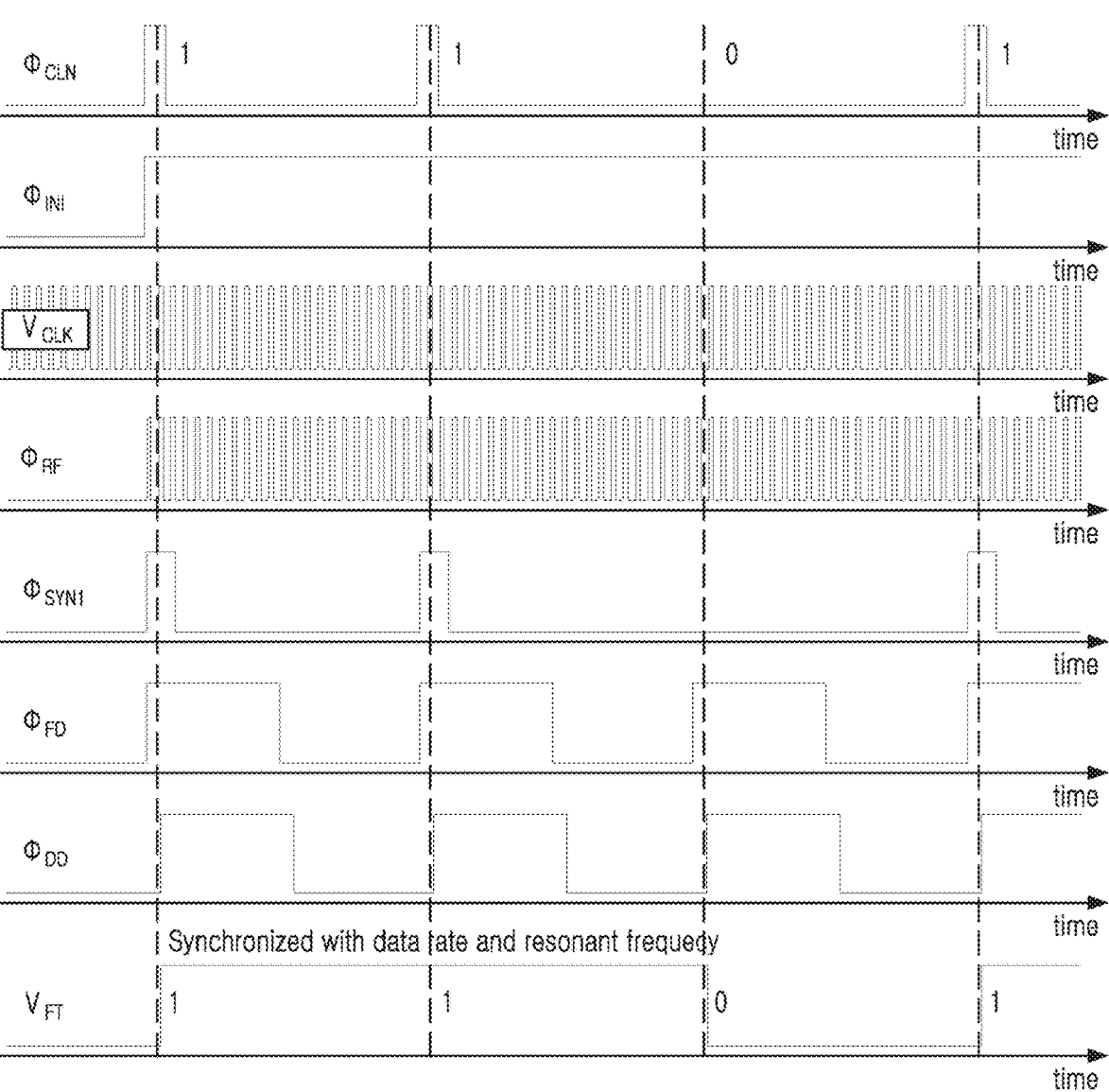
FIG. 7B is a waveform for explaining a demodulation module in accordance with an embodiment.

FIG. 7 is a circuit diagram and a waveform for explaining the demodulation module 150 shown in FIG. 5. Specifically, FIG. 7a is a circuit diagram of the demodulation module 150, and FIG. 7b is a view showing a waveform in the demodulation module 150.

As shown in FIG. 7, the demodulation module 150 may include a digital cleaner unit 151 and a synchronization unit 153.

The digital cleaner unit 151 according to the present embodiment is provided to generate a clean signal $\Phi_{CLN}$ by removing the resonant frequency noise of the ASK modulation signal from the sample signal VS.

Figure 8A:
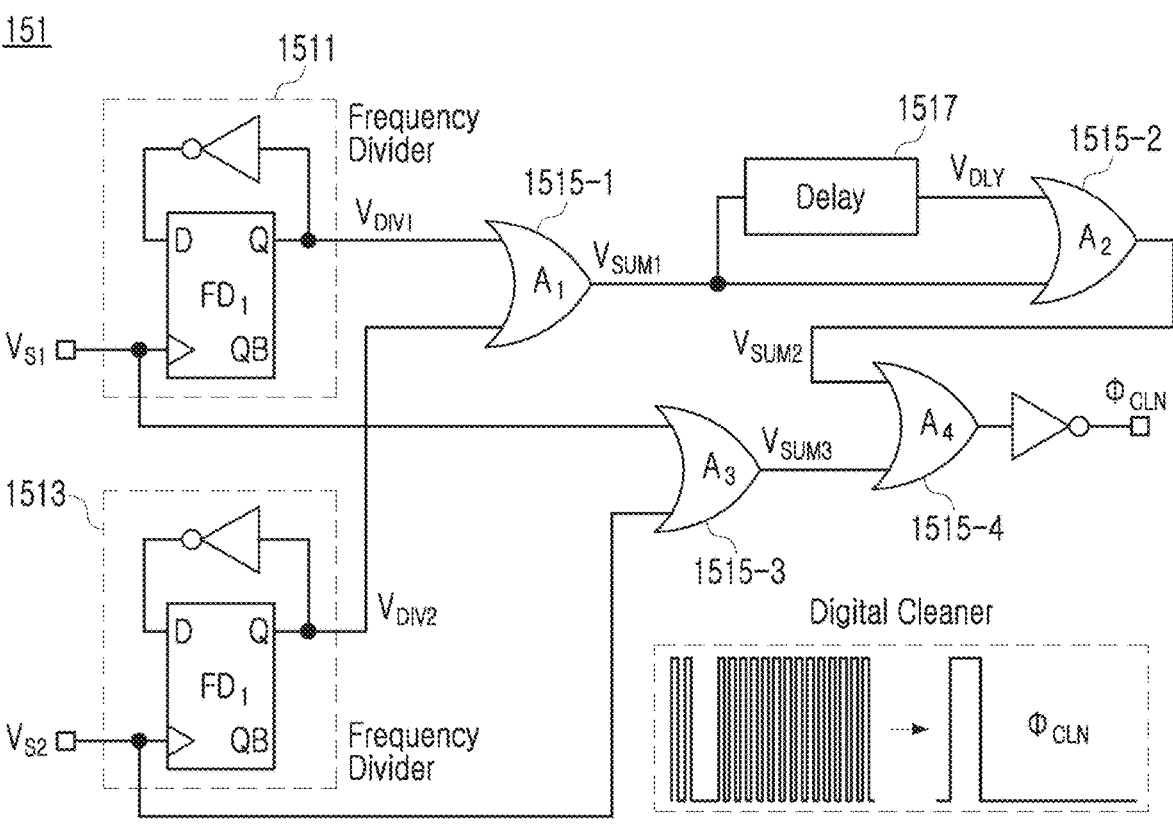
FIG. 8A is a circuit diagram of a digital cleaner unit in accordance with an embodiment.
Figure 8B:
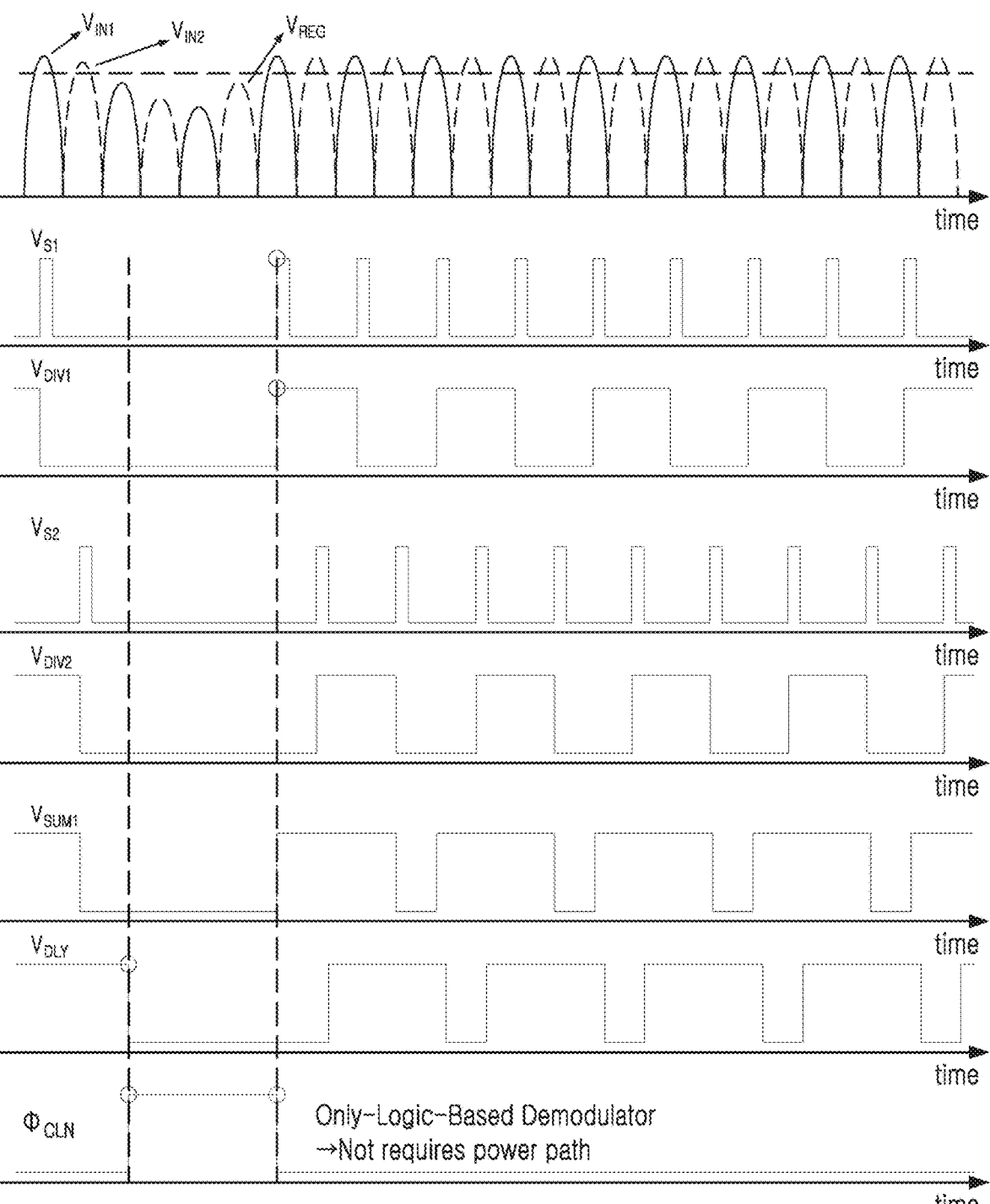
FIG. 8B is a waveform for explaining a digital cleaner unit in accordance with an embodiment.

FIG. 8 is a circuit diagram and a waveform for explaining the digital cleaner unit 151 shown in FIG. 7. Specifically, FIG. 8a is a circuit diagram for explaining the configuration of the digital cleaner unit 151, and FIG. 8b is a view showing the waveform of each signal according to the digital cleaner unit 151.

As shown in FIG. 8a, the digital cleaner unit 151 according to the present embodiment includes a first frequency divider 1511, a second frequency divider 1513, a plurality of adders 1515-1 to 1515-4, and a delay cell 1517.

The first frequency divider 1511 may output a first frequency division signal VDIV1 as a first sample signal VS1 is applied.

The second frequency divider 1513 may output a second frequency division signal VDIV2 as a second sample signal VS2 is applied.

Considering that the pulse widths of the first frequency division signal VDIV1 and the second frequency division signal VDIV2 are much larger than those of the first sample signal VS1 and the second sample signal VS2, the signal can be managed more easily and errors can be reduced through the frequency dividers 1511 and 1513 of the digital cleaner unit 151 according to the present embodiment.

Meanwhile, the plurality of adders 1515-1 to 1515-4 may include first to fourth adders 1515-1 to 1515-4. The plurality of adders 1515-1 to 1515-4 are provided to add signals.

First, the first adder 1515-1 may output a first sum signal VSUM1 by adding the first frequency division signal VDIV1 and the second frequency division signal VDIV2.

Meanwhile, the delay cell 1517 may output a delay signal VDLY as the first sum signal VSUM1 is input. In addition, the degree of delay by the delay cell 1517 is determined by the designer and may be changed as desired.

The second adder 1515-2 may output a second sum signal VSUM2 by adding the first sum signal VSUM1 and the delay signal VDLY.

The third adder 1515-3 may output a third sum signal VSUM3 by adding the first sample signal VS1 and the second sample signal VS2.

The fourth adder 1515-4 may output a clean signal $\Phi_{CLN}$ by adding the third sum signal VSUM3 and the second sum signal VSUM2.

The clean signal $\Phi_{CLN}$ may be 1 only when FT input data is 1, and synchronization with the resonant frequency and the data rate is essential for the clean signal $\Phi_{CLN}$ to be effectively utilized in WPT applications.

Therefore, the synchronization unit 153 according to the present embodiment is provided to synchronize the clean signal $\Phi_{CLN}$ according to the resonant frequency and the data rate of the ASK modulation signal.

To this end, the synchronization unit 153 according to the present embodiment may include a first clock generator 1531, a starter 1532, a second clock generator 1533, a first synchronizer 1534-1, a frequency divider 1535, a delayer 1536, and a second synchronizer 1534-2 as shown in FIG. 7*a*.

First, the first clock generator 1531 according to the present embodiment may generate a first clock signal VCLK having a resonant frequency from the first input voltage VIN1 and the second input voltage VIN2.

Meanwhile, the starter 1532 may generate a start signal $\Phi_{INI}$ when the clean signal $\Phi_{CLN}$ becomes '1'.

When the start signal $\Phi_{INI}$ is generated, the second clock generator 1533 may generate a second clock signal $\Phi_{RF}$ that becomes the rising edge and has a resonant frequency when the clean signal $\Phi_{CLN}$ becomes '1'.

The first synchronizer 1534-1 may generate a first synchronization signal $\Phi_{SYN1}$, which is a clean signal synchronized with the second clock signal $\Phi_{RF}$, using the second clock signal $\Phi_{RF}$ and the clean signal $\Phi_{CLN}$ as inputs.

In addition, the frequency divider 1535 may be provided to divide the second clock signal $\Phi_{RF}$ by frequency.

As shown in FIG. 7*a*, the frequency divider 1535 is designed as a D-FF array FD5 to FD9 to divide the second clock signal $\Phi_{RF}$ five times and output a signal $\Phi_{FD}$ having $\frac{1}{5}$ of the resonant frequency.

The delayer 1536 is provided to generate a signal having a pulse width of the resonant frequency by delaying the frequency-divided second clock signal for a preset cycle.

That is, the delayer 1536 may generate $\Phi_{DD}$, which is a signal having a pulse width of the resonant frequency, by delaying $\Phi_{FD}$, which is the frequency-divided second clock signal, for several cycles.

The second synchronizer 1534-2 may output a second synchronization signal synchronized with the resonant frequency and the data rate using the output signal of the delayer 1536 and the first synchronization signal $\Phi_{SYN1}$ as inputs. The second synchronization signal output from the second synchronizer 1534-2 may be finally output as a demodulation signal VFT that demodulates the ASK modulation signal.

In other words, the second synchronizer 1534-2 may finally output the demodulation signal VFT, which is a synchronized clean signal based on the resonant frequency and the data rate, as a signal that demodulates the ASK modulation signal, using the first synchronization signal $\Phi_{SYN1}$ and $\Phi_{DD}$, which is a signal having a pulse width of the resonant frequency as inputs.

Through this, it is possible to provide a forward data receiving device 100 designed with a digital logic structure that eliminates an envelope detector and consumes very small power.

According to one aspect of the present invention described above, as a forward data receiving device that does not require an envelope detector using only digital circuits is provided, the size of a chip, as well as power consumption, can be reduced by omitting the envelope detector, which is an analog circuit block that consumes a large amount of power.

Although various embodiments of the present invention have been illustrated and described above, the present invention is not limited to the specific embodiments described above, and various modifications may be made by those skilled in the art without departing from the gist of the present invention as claimed in the claims. Furthermore, such modifications should not be individually understood from the technical spirit or prospect of the present invention.

DESCRIPTION OF SYMBOLS

100: Receiving device
110: Input module
130: Resonance regulating rectifier module
150: Demodulation module

What is claimed is:

1. A forward data receiving device that demodulates and receives an Amplitude Shift Keying (ASK) modulation signal, the device comprising:

an input circuit configured to receive the ASK modulation signal as an input;

a resonance regulating rectifier circuit configured to regulate and rectify an input voltage of the ASK modulation signal on the basis of Pulse Width Modulation (PWM) according to a preset target voltage, and apply a regulated voltage through an output transistor; and a demodulation circuit based on a digital logic circuit, configured to demodulate the ASK modulation signal according to a trend in a change of the input voltage compared to the regulated voltage, wherein the resonance regulating rectifier circuit includes a comparison circuit configured to generate a gate signal for controlling on/off of the output transistor, and generate a sample signal for demodulating the ASK modulation signal according to the trend in the change of the input voltage compared to the regulated voltage.

2. The device according to claim 1, wherein the demodulation circuit includes:

a digital cleaner circuit configured to generate a clean signal by removing a resonant frequency noise of the ASK modulation signal from the sample signal; and a synchronization circuit configured to synchronize the clean signal according to the resonant frequency and a data rate of the ASK modulation signal.

3. The device according to claim 2, wherein the resonance regulating rectifier circuit further includes a conversion circuit configured to convert the input voltage into a half-wave voltage, and branch the input voltage into a path of a first input voltage and a path of a second input voltage, wherein the comparison circuit includes:

a first comparison circuit configured to generate a first gate signal and a first sample signal for controlling on/off of a first output transistor corresponding to the path of the first input voltage; and a second comparison circuit configured to generate a second gate signal and a second sample signal for controlling on/off of a second output transistor corresponding to the path of the second input voltage.

4. The device according to claim 3, wherein the digital cleaner circuit includes:

a first frequency divider configured to output a first frequency division signal as the first sample signal is applied;

a second frequency divider configured to output a second frequency division signal as the second sample signal is applied;

a first adder configured to output a first sum signal by adding the first frequency division signal and the second frequency division signal;

a delay cell configured to output a delay signal as the first sum signal is input;

a second adder configured to output a second sum signal by adding the first sum signal and the delay signal;

a third adder configured to output a third sum signal by adding the first sample signal and the second sample signal; and a fourth adder configured to output the clean signal by adding the third sum signal and the second sum signal.

5. The device according to claim 3, wherein the synchronization circuit includes:

a first clock generator configured to generate a first clock signal having the resonant frequency from the first input voltage and the second input voltage;

a starter configured to generate a start signal when the clean signal becomes '1';

a second clock generator configured to generate, when the start signal is generated, a second clock signal that becomes a rising edge and has the resonant frequency when the clean signal becomes '1';

a first synchronizer configured to generate a first synchronization signal, which is a clean signal synchronized with the second clock signal, using the second clock signal and the clean signal as inputs;

a frequency divider configured to divide the second clock signal by frequency;

a delayer configured to generate a signal having a pulse width of the resonant frequency by delaying the frequency-divided second clock signal for a preset cycle; and a second synchronizer configured to finally output a second synchronization signal synchronized with the resonant frequency and the data rate using an output signal of the delayer and the first synchronization signal as inputs as a demodulation signal that demodulates the ASK modulation signal.

6. The device according to claim 3, wherein each of the first comparison circuit and the second comparison circuit includes:

a common gate comparator configured to compare the first input voltage or the second input voltage with the regulated voltage, and output a comparison voltage signal, which is a section in which the first input voltage or the second input voltage is higher than the regulated voltage; and a sample signal generator configured to generate a sample signal, which is a signal that includes information on a starting point and an ending point of the comparison voltage signal such that a pulse signal has a rising edge at the starting point and a falling edge at the ending point of the comparison voltage signal.

7. The device according to claim 6, wherein each of the first comparison circuit and the second comparison circuit further includes:

a PWM controller configured to generate a PWM control signal by comparing the regulated voltage and the target voltage so that the regulated voltage follows the target voltage; and a gate signal driver configured to generate a gate signal for controlling on/off of the output transistor according to the comparison voltage signal and the PWM control signal.

8. The device according to claim 7, wherein the gate signal driver includes:

an OR gate configured to generate a protection voltage signal by applying an OR logic operation to a signal applying a rising edge trigger to the PWM control signal and a signal applying a rising edge trigger to the ending point of the comparison voltage signal; and an SR latch configured to receive a signal applying a falling edge trigger at the starting point of the comparison voltage signal and the protection voltage signal, and generating the gate signal having a falling edge at the starting point of the comparison voltage signal and a rising edge at a timing of controlling the regulated voltage.

* * * * *